(12) United States Patent
Goruganthu et al.

(10) Patent No.: US 6,414,335 B1
(45) Date of Patent: Jul. 2, 2002

(54) SELECTIVE STATE CHANGE ANALYSIS OF A SOI DIE

(75) Inventors: Rama R. Goruganthu; Michael R. Bruce; Brennan V. Davis; Rosalinda M. Ring, all of Austin; Daniel L. Stone; Jeffrey D. Birdsley, both of Cedar Park, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/864,688

(22) Filed: May 23, 2001

(51) Int. Cl.[7] .................. H01L 23/58; H01L 27/108; H01L 29/76; H01L 29/94; H01L 31/119
(52) U.S. Cl. .................. 257/48; 257/296; 257/350
(58) Field of Search .................. 257/48, 296, 350

(56) References Cited

U.S. PATENT DOCUMENTS 5,920,067 A * 7/1999 Cresswell et al. .......... 250/306
6,309,897 B1 * 10/2001 Livengood .................. 438/14
6,323,522 B1 * 11/2001 Hargrove et al. .......... 257/347

* cited by examiner

Primary Examiner—Ngân V. Ngô

(57) ABSTRACT

Analysis of a semiconductor die having silicon-on-insulator (SOI) structure is enhanced by capacitively coupling a signal to the die. According to an example embodiment of the present invention, a die having a thinned back side is analyzed by capacitively coupling an input signal through the insulator portion of the SOI structure and effecting a state change to circuitry in the die. The state change is used to evaluate a characteristic of the die, such as by detecting a response to the state change. The ability to force such a state change is helpful for evaluating dies having SOI structure, and is particularly useful for evaluation techniques that require or benefit from maintaining the insulator portion of the SOI structure intact.

20 Claims, 2 Drawing Sheets

SELECTIVE STATE CHANGE ANALYSIS OF A SOI DIE

RELATED PATENT DOCUMENTS

The Patent Document is related to U.S. patent application Ser. No. 09/864,665, entitled "Timing Margin Alteration Via the Insulator of a SOI Die," and to U.S. patent application Ser. No. 09/864,708, entitled "Logic State Mapping in a SOI Die," and both filed concurrently herewith.

FIELD OF THE INVENTION

The present invention relates generally to semiconductor devices and their fabrication and, more particularly, to testing and analysis of semiconductor dies involving the alteration of the timing margin of the die.

BACKGROUND OF THE INVENTION

The semiconductor industry has recently experienced technological advances that have permitted dramatic increases in integrated circuit density and complexity, and equally dramatic decreases in power consumption and package sizes. Present semiconductor technology now permits single-die microprocessors with many millions of transistors, operating at speeds of hundreds of millions of instructions per second to be packaged in relatively small, air-cooled semiconductor device packages. As clock frequencies increase, problems associated with the proper timing of various semiconductor die operations increase.

A by-product of such high-density and high functionality is an increased demand for products employing these microprocessors and devices for use in numerous applications. As the use of these devices has become more prevalent, the demand for faster operation and better reliability has increased. Such devices often require manufacturing processes that are highly complex and expensive.

As manufacturing processes for semiconductor devices and integrated circuits increase in difficulty, methods for testing and debugging these devices become increasingly important. Not only is it important to ensure that individual dies are functional, it is also important to ensure that batches of dies perform consistently. In addition, the ability to detect a defective manufacturing process early is helpful for reducing the number of defective devices manufactured.

Traditionally, integrated circuits have been tested using methods including directly accessing circuitry or devices within the integrated circuit. Directly accessing the circuitry is difficult for several reasons. For instance, in flip-chip type dies, transistors and other circuitry are located in a very thin epitaxially grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the die.

One particular type of semiconductor device structure that presents unique challenges to back side circuit analysis is silicon-on-insulator (SOI) structure. Forming a SOI structure involves forming an insulator, such as an oxide, over bulk silicon in the back side of a semiconductor device. A thin layer of silicon is formed on top of the insulator, and circuitry is formed over the insulator. The resulting SOI structure exhibits benefits including reduced switch capacitance, which leads to faster operation. Direct access to circuitry for analysis of SOI structure, however, involves milling through the oxide. The milling process can damage circuitry or other structure in the device. Such damage can alter the characteristics of the device and render the analysis inaccurate. In addition, the milling process can be time-consuming, difficult to control, and expensive.

One aspect of integrated circuit die operation that is important for analyzing dies involves the logic state of various circuitry in the die. Malfunctions or design problems are often related to certain circuitry that is not operating at the proper logic state, or is delayed in getting to or changing from a selected logic state. The detection of selected logic states is useful for various reasons, including determining whether a particular die is operating properly, and for isolating defects in a die. In SOI dies, detecting particular logic states can be difficult, however, for reasons including those stated hereinabove and related to the challenges presented to accessing circuitry in the die for such analysis.

The difficulty, cost, and destructive aspects of existing methods for testing integrated circuits present challenges to the growth and improvement of semiconductor technologies involving SOI structure.

SUMMARY OF THE INVENTION

The present invention is directed to a method and system for analyzing a semiconductor die having silicon-on-insulator (SOI) structure in a manner that addresses the above-mentioned challenges. The present invention is exemplified in a number of implementations and applications, some of which are summarized below.

According to an example embodiment of the present invention, a semiconductor die having SOI structure and circuitry in a circuit side opposite a back side is analyzed. In a typical application, a portion of substrate is removed from the back side of the semiconductor die, and an electrical input is capacitively coupled through the insulator portion of the SOI structure. The input is selected to force a state change in circuitry in the die. For example, in one implementation, forcing a state change includes capacitively coupling a voltage to the circuitry and causing the circuitry to take on a selected state and/or isolating the circuitry. The resulting state change is used to evaluate a characteristic of the die.

According to another example embodiment of the present invention, a system is adapted for analyzing a semiconductor die having silicon-on-insulator (SOI) structure and circuitry in a circuit side opposite a back side. The system includes a probe adapted to capacitively couple an electrical input through the insulator portion of the SOI structure and selectively effect a state change to circuitry in the die. A detector is adapted to use the selected state change to evaluate a characteristic of the die.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
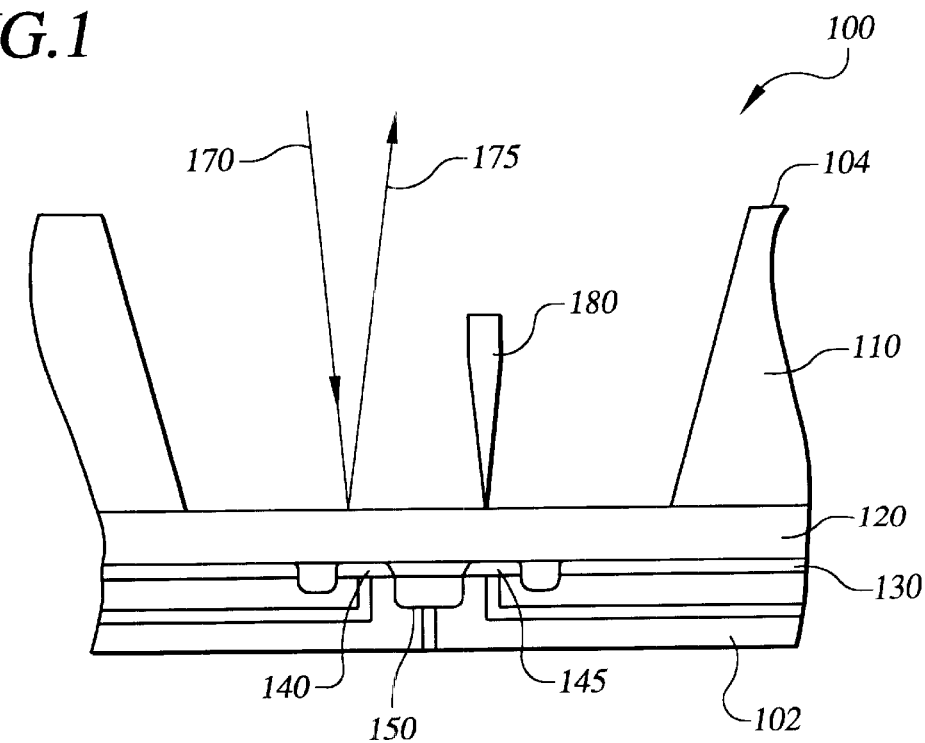
FIG. 1 is a semiconductor die having SOI structure and undergoing analysis, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for flip-chips and other devices having silicon-on-insulator (SOI) structure and requiring or benefiting from analysis involving the operational state of a semiconductor die. While the present invention is not necessarily limited to such devices, various aspects of the invention may be appreciated through a discussion of various examples using this context.

According to an example embodiment of the present invention, a semiconductor die having SOI structure and a back side opposite circuitry in a circuit side is analyzed. The back side of the die is thinned, and an electrical input is capacitively coupled to a portion of the circuitry through the insulator of the SOI structure. The electrical input is directed to a portion of the die and forces selected circuitry to take on an electrical state. The input may include, for example, a charge coupled to the circuitry via an electron-beam probe and/or a signal coupled to the selected circuitry by isolating the circuitry from one or more other circuit components in the die. In the instance of an electron-beam probe, the application of the probe is selected to achieve a desired result, such as by raster scanning the probe across the die, stepping it across the die, pulsing it and/or directing it in a spot mode at a selected portion of the die.

Once the input has forced the circuitry to undergo a state change, the change is used to evaluate the die. For example, the state change itself may be indicative of a particular characteristic, such as the die's logic state or susceptibility to a state change. These and other characteristics are used to evaluate the integrity of a die during design, after manufacture or at any desired time. The ability to identify potential defects, such as design or manufacturing defects, enhances the ability to analyze such dies after manufacturing, and enhances the design of the die prior to implementation.

In a more particular example embodiment of the present invention, the circuitry being analyzed is electrically isolated from one or more portions of the die. This is accomplished in a suitable manner, such as by milling through the back side of the die and through an interconnect, thereby breaking an electrical connection in the die.

In one implementation, only a portion of the circuit to be analyzed is isolated, and a charge is capacitively coupled to that portion. For example, a source/drain region of a transistor can be isolated by cutting the interconnect leading to it. An electron-beam probe is directed to the insulator portion adjacent the source/drain region and a charge generated at the insulator portion by the electron-beam is coupled to the source/drain region. A signal, such as an electrical response, is obtained from the die and used to evaluate a characteristic of the die. As an alternate or in addition to the electron-beam probe, a metal contact is formed extending to the insulator and is used to couple a signal to the source/drain region.

In another implementation, an entire circuit element, such as a transistor, is isolated by milling through both the back side and the insulator and cutting the interconnects leading to the transistor. The operation of the transistor is then evaluated by capacitively coupling a signal to a source/drain region of the transistor and forcing a state change therein. In one particular implementation, an opening is made in the die to sever the interconnects, and conductive material is deposited in the opening or openings to form one or more conductors for coupling a signal to the transistor. The conductors are used to supply an electrical signal to the transistor, and a state in a source/drain region is forced via capacitively coupling through the insulator.

In one particular example embodiment of the present invention, the semiconductor die is operated and held in a static state near a transition point between defective and recovery states. A state change in a selected portion of the circuitry is forced using one or more ways in which to capacitively couple a signal, such as described hereinabove. A response from the die is detected and used to evaluate a device or circuit path in the die that is suspected to include a defect. In a more particular example, the die is operated in a loop cycle near the transition point, such as in a loop that causes the die to fail at a selected rate. The probe is continually scanned across the die while the die is cycled, and a state change is forced in a portion of the die being scanned. This enables the detection of defects that may not occur on a consistent basis, as well as the identification of a circuit path that is more likely to respond to a state change than another circuit path.

The electron beam probe is particularly useful for altering the voltage state of the circuit portion of the die underlying the portion of the insulator being probed. When the electron beam is directed to the insulator, a charge is generated at the insulator and capacitively couples to and changes the voltage of the underlying circuitry. In this manner, a selected logic state of the circuitry is forced and is used in the evaluation of the die.

One application for which the present invention is particularly useful involves distinguishing a resistive defect from other operational defects in a die. At times, particular failure modes in a die are used to pinpoint a particular type of defect. However, such failure modes can be inadequate for appropriately locating a defective portion of the die when the die includes a resistive circuit path because such a resistive path can generate a false failure mode. By forcing a state change in the die, a circuit path containing a resistive defect is caused to fail, the failure is detected and used to identify the defect. For more information regarding the detection of resistive defects, reference may be made to U.S. patent application Ser. No. 09/586,518, entitled "Resistivity Analysis" and filed on Jun. 2, 2000.

FIG. 1 shows a portion of a flip-chip die 100 undergoing analysis, according to an example embodiment of the present invention. The die exemplifies one of a variety of dies having SOI structure for which the present invention is applicable. The die is in an inverted position with a circuit side 102 facing down and a back side 104 facing up, such as would be a flip-chip die bonded to a package substrate. A portion of bulk silicon 110 in the back side has been removed to expose an insulating layer 120, such as a buried oxide (BOX) layer. The substrate removal is accomplished using a conventional method, such as by global thinning, local thinning or a combination thereof. The silicon substrate can be removed, for example, using commonly available substrate removal methods and devices, such as using a focused ion beam (FIB), a laser etching device, or an etch chamber having an etch gas and used in combination with a masking step. A thin layer of silicon 130, in combination with the insulator, forms a SOI structure. Source/drain regions 140 and 145 are located in the thin layer of silicon 130, and a gate 150 is located over the thin layer of silicon. The source, drain and gate make up a SOI transistor.

The die is powered, and an electron beam 170 is directed at an exposed portion 125 of the insulator 120 to couple a charge to and force a state change in the source/drain region 140. Alternative embodiments involve capacitively coupling a charge through a partially-removed insulator layer, through the bulk silicon 110 and/or by electrically coupling to the source/drain region via interconnects in the die. In addition, a conductive probe 180 is used to couple a signal to circuitry in the die via the insulator in selected applications, and is either part of a probing arrangement or is formed by deposition of conductive material in the back side of the die. Sufficient substrate is removed to facilitate capacitively coupling between a surface of the exposed portion and a source/drain region. A response to the forced state change is used to evaluate a characteristic in the die, such as to identify a circuit path that potentially includes a design or manufacturing defect, enhanced by the forced state change. In one implementation, an electrical response to the forced state change is detected via electrical connection to interconnects in the die, and in another implementation a secondary response, such as secondary electrons 175, is detected.

Although FIG. 1 shows a small portion of the insulator 120 having been exposed, various implementations of the present invention are directed toward a die having a larger portion of the insulator removed, and in some instances is applied to dies having the entire insulator layer exposed. In these instances, the probe is scanned over one or more areas of the die and used to force a state change in one or more portions of circuitry in the die. This is particularly useful for identifying the location of a defect from among several potential defective locations. In this manner, defect analysis is shortened in time and thereby can be performed in a more cost-effective and efficient way.

Figure 2:
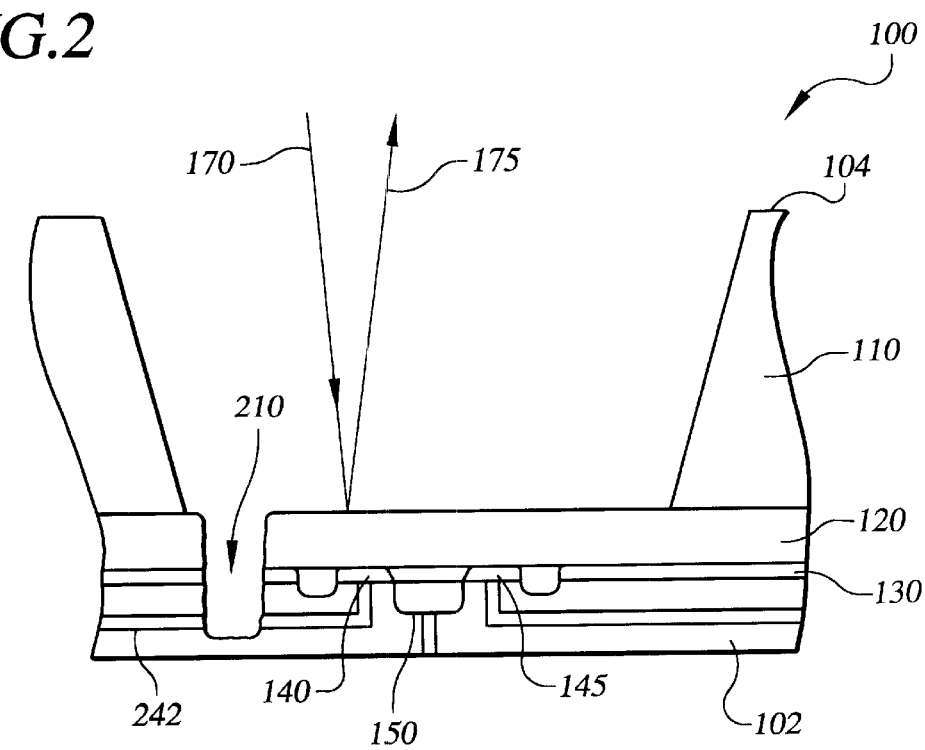
FIG. 2 is the semiconductor die of FIG. 1 undergoing analysis, according to another example embodiment of the present invention.

FIG. 2 shows a die similar to that of FIG. 1, undergoing a different type of analysis, according to another example embodiment of the present invention. In this instance, a portion of the insulator 120, epitaxial silicon 130 and interconnect 242 have been milled through in region 210. The source/drain region 140 has thus been isolated from circuitry to which it was previously connected via interconnect 242. An electron beam 170 is directed at the insulator portion over the source/drain region 140 and is used to force a state change therein. The transistor can then be evaluated, such as by powering under normal or other selected operating conditions, while controlling the state of the source/drain region 140.

Figure 3:
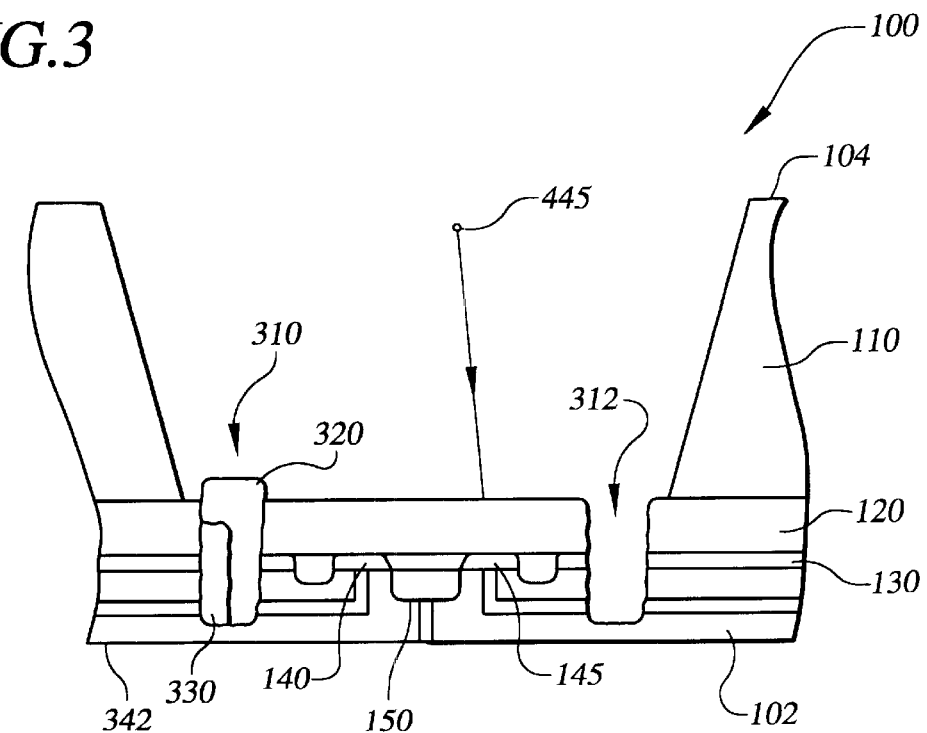
FIG. 3 is the semiconductor die of FIG. 1 undergoing analysis, according to another example embodiment of the present invention.

FIG. 3 also shows a die similar to that of FIG. 1, having a conductor formed therein, according to another example embodiment of the present invention. Once the bulk silicon 110 has been removed to expose a portion of the insulator 120, an opening 310 is milled to break a connection in interconnect 342. Conductive material 320 is formed in the opening and is used to make contact to the portion of interconnect 342 still in contact with source/drain region 140. An insulator 330 is also deposited in the opening 310 and is used to maintain electrical isolation of the source/drain region from other portions of circuitry coupled to the interconnect 342. Another opening 312 is also milled into the die to electrically isolate the source/drain region 145 from other circuitry in the die. The opening 312 is optionally filled with conductive material, insulating material, or a combination thereof to meet selected analysis requirements. Contact is then made to the conductor 320 and used to electrically couple to the source/drain region 140. An electron beam 445 is directed at the insulator portion over the source/drain region 145 and used to couple a capacitance to and force a state change therein, and the die is evaluated in response to the forced state change.

Figure 4:
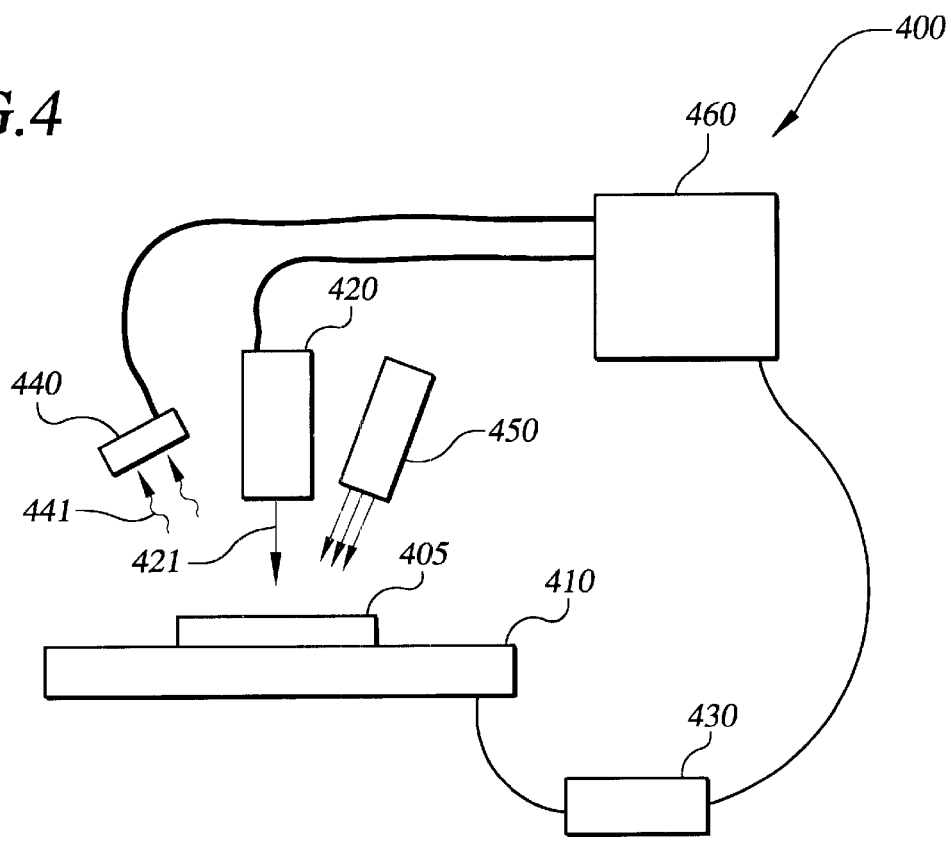
FIG. 4 is a system for analyzing a semiconductor die, according to another example embodiment of the present invention.

According to another example embodiment of the present invention, FIG. 4 shows a system 400 adapted to force a state change in a semiconductor die 405 having SOI structure. The system 400 includes a substrate removal device 450 adapted to remove substrate from a back side of the die and to form an exposed region. In one implementation, the substrate removal device includes a FIB, and in another implementation, the substrate removal device includes a laser-etching device. The die is positioned on a stage 410 and electrically coupled via the stage to an input device 430, such as a signal generator, adapted to power the die and obtain an electrical response from the die.

A probing arrangement 420 is adapted to direct an electron beam 421 at the insulator portion of the die, capacitively couple a charge to a selected portion of circuitry in the die and force a state change therein. The probe arrangement and substrate removal devices are shown optionally coupled to a controller 460 that includes a computer arrangement adapted to control the electron beam and/or the substrate removal device. In one implementation, the computer arrangement is adapted to interpret response characteristics for analyzing the semiconductor die. The system further includes a detection arrangement 440 adapted to detect secondary electrons 441 emitted from the die in response to the forced state change, and provides a manner in which to evaluate the die as an alternative or in addition to electrically evaluating the die with the tester 430. Other detectors and probes (not shown), such as a microscope, a laser and other commonly-used devices are also coupled to and used with the system 400 as desired to evaluate a die.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor die having silicon-on-insulator (SOI) structure and circuitry in a circuit side opposite a back side, the method comprising:

capacitively coupling an electrical input through the insulator portion of the SOI structure and selectively effecting a state change to circuitry in the die; and using the selected state change to evaluate a characteristic of the die.

2. The method of claim 1, further comprising thinning the back side of the die, and wherein capacitively coupling an electrical input includes directing an electron-beam probe at a selected portion of the thinned back side of the die to electrically couple a capacitance load to underlying circuitry via the insulator of the SOI structure and selectively effecting the state-change.

3. The method of claim 1, wherein capacitively coupling an electrical input includes isolating the circuitry to which the state change is to be selectively effected.

4. The method of claim 3, wherein isolating the circuitry includes milling through a portion of the insulator in the SOI structure, removing a portion of the circuitry and electrically isolating the circuitry.

5. The method of claim 1, further comprising operating the circuitry at a static logic state.

6. The method of claim 1, further comprising operating the circuitry near a state-changing transition between a failed mode and a recovered mode, and wherein effecting a state change includes causing the circuitry to transition between the failed mode and the recovered mode.

7. The method of claim 2, wherein directing an electron-beam probe includes scanning an electron beam across the thinned back side of the die.

8. The method of claim 1, wherein using the selected state change to evaluate a characteristic of the die includes identifying the circuitry undergoing the state-changing operation as one containing a suspect circuit path.

9. The method of claim 8, wherein identifying the circuitry path includes determining that the circuit path is more likely to respond to a change in state than another circuit path in the die.

10. The method of claim 1, wherein selectively effecting a state-change includes causing a source/drain region located in the SOI structure to change voltage.

11. The method of claim 1, further comprising thinning the die back side and exposing at least a portion of the insulator.

12. The method of claim 1, wherein operating circuitry includes operating the die in a loop that is known to cause a failure to occur at a selected rate.

13. The method of claim 1, wherein electrically coupling a capacitance load to underlying circuitry includes capacitively coupling through the insulator portion of the SOI and inducing a voltage upon the underlying circuitry.

14. The method of claim 1, wherein using the selected state change to evaluate a characteristic of the die includes at least one of: detecting an electrical response from the die via interconnects coupled to the die, and detecting secondary electrons from the die generated in response to an electron beam probe and to the state change to the underlying circuitry.

15. A system for analyzing a semiconductor die having silicon-on-insulator (SOI) structure and circuitry in a circuit side opposite a back side, the system comprising:
   means for capacitively coupling an electrical input through the insulator portion of the SOI structure and selectively effecting a state change to circuitry in the die; and
   means for using the selected state change to evaluate a characteristic of the die.

16. A system for analyzing a semiconductor die having silicon-on-insulator (SOI) structure and circuitry in a circuit side opposite a back side, the system comprising:
   a probe adapted to capacitively couple an electrical input through the insulator portion of the SOI structure and selectively effect a state change to circuitry in the die; and
   a detector adapted to use the selected state change to evaluate a characteristic of the die.

17. The system of claim 16, further comprising a substrate removal arrangement adapted to remove substrate from a back side of the semiconductor die and expose the insulator portion of the SOI structure.

18. The system of claim 16, wherein the detector includes at least one of: a laser probe, a microscope, an electron beam probe and an electronic testing device.

19. The system of claim 16, wherein the probe includes at least one of: an electron beam probe, a conductive probe and a laser probe.

20. The system of claim 16, wherein the detector is adapted to use the detected response to identify circuit paths within the die that are subject to failure at a greater rate than other circuit paths in the die.

* * * * *